United States Patent [19]
Morita

[11] Patent Number: 5,357,133
[45] Date of Patent: Oct. 18, 1994

[54] SEMICONDUCTOR MEMORY DEVICE HAVING IMPROVED WRITE CHARACTERISTIC

[75] Inventor: Shigeru Morita, Fujisawa, Japan

[73] Assignee: Kabushiki Kaisha Toshiba, Kawasaki, Japan

[21] Appl. No.: 982,844

[22] Filed: Nov. 30, 1992

[30] Foreign Application Priority Data

Nov. 29, 1991 [JP] Japan ................... 3-315836

[51] Int. Cl.⁵ ................... H01L 29/78; H01L 27/02
[52] U.S. Cl. ................... 257/316; 257/322; 257/374
[58] Field of Search ................ 257/316, 322, 374, 315

[56] References Cited

U.S. PATENT DOCUMENTS

| | | | |
|---|---|---|---|
| 4,114,255 | 9/1978 | Salsbury et al. | 257/316 |
| 5,231,299 | 7/1993 | Ning et al. | 257/316 |

*Primary Examiner*—Gene M. Munson
*Attorney, Agent, or Firm*—Spensley Horn Jubas & Lubitz

[57] ABSTRACT

The present invention comprises a groove formed in a semiconductor substrate, a buried element isolation region formed in the groove, source and drain diffusion regions formed inside the buried element isolation region, an electrode wiring layer connected the buried element isolation region across the diffusion regions and constituted by a two-layered structure consisting of a control gate and a floating gate, and a side-wall diffusion region which extends along the groove, is in contact with the source and drain diffusion regions, and is formed at a position corresponding to at least the electrode wiring layer. As a result, the write characteristic of a non-volatile memory can be improved, and at the same time, the non-volatile memory can be micropatterned.

7 Claims, 5 Drawing Sheets

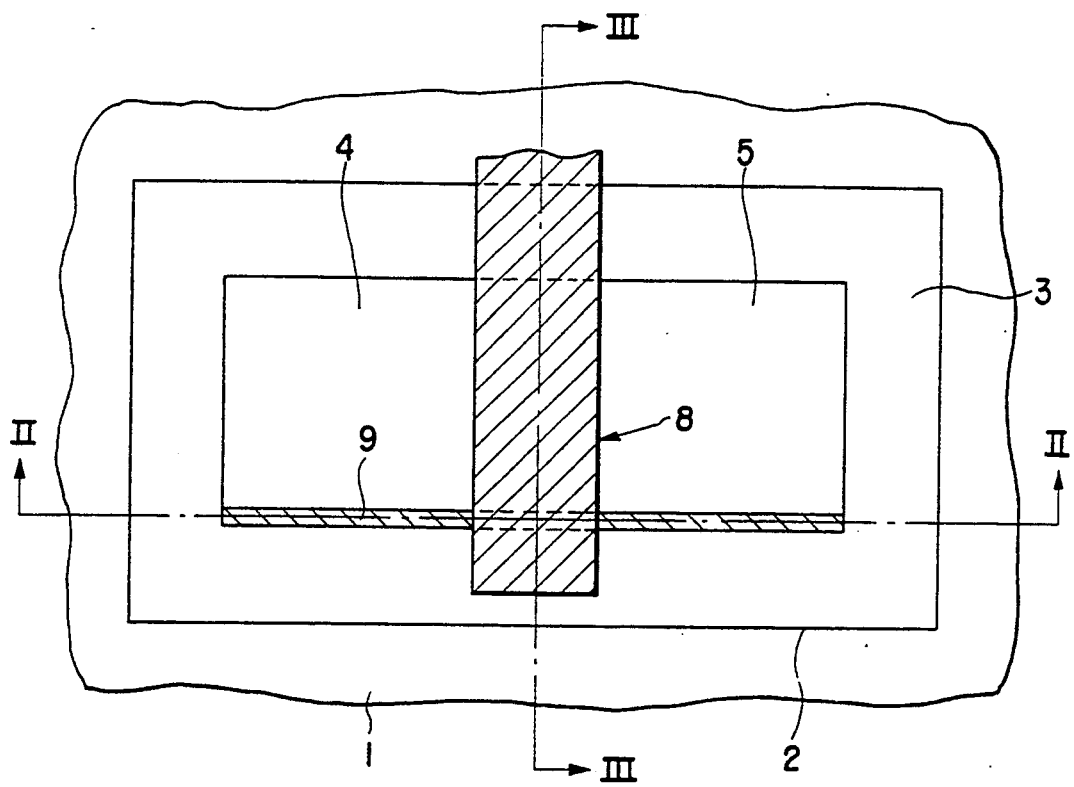
F I G. 3
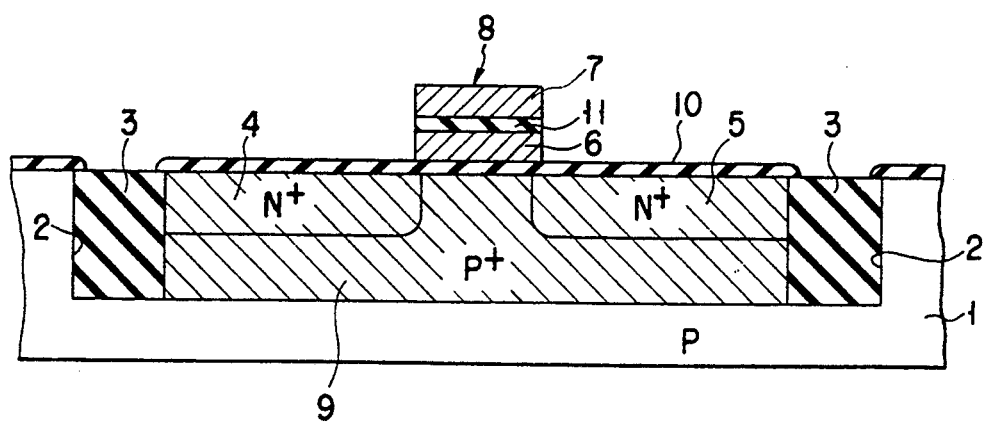
F I G. 4

SEMICONDUCTOR MEMORY DEVICE HAVING IMPROVED WRITE CHARACTERISTIC

BACKGROUND OF THE INVENTION

1. Field of the Invention

The present invention relates to a semiconductor device and a method of manufacturing the same and, more particularly, to the structure of a non-volatile semiconductor device using buried element isolation region and a method of manufacturing the semiconductor device.

2. Description of the Related Art

FIG. 1 is a plan view showing a part of a conventional non-volatile memory using a floating gate, and FIG. 2 is a sectional view showing the non-volatile memory along a line I—I in FIG. 1. A non-volatile memory using a floating gate 6 as an electrode wiring layer employs the following method in order to improve a write characteristic. That is, a region 22a doped with a high-concentration impurity of the same conductivity type as that of a semiconductor substrate 1 is formed at a part of a channel region 22 of a transistor to improve a hot carrier effect. In this example, the impurity region 22a having an impurity concentration higher than that of the P-type semiconductor substrate 1 is of a $p^-$-type. In the above method, the impurity concentration of the channel region 22 cannot be increased throughout the entire region because the characteristics of the transistor are degraded. For this reason, using a photoresist 21 as a mask for the region 22, the high-concentration impurity region 22a is locally formed by implanting ions from an opening 21a. Reference numeral 4 denotes a source diffusion region; 5, a drain diffusion region; 7, a control gate; 10 and 11, gate oxide films; and 20, an element isolation oxide film. According to the prior art using a photoresist, since an alignment margin must be assured for mask alignment precision and thus an occupied area of a cell is increased, formation of a micropatterned non-volatile memory has limitations.

SUMMARY OF THE INVENTION

It is an object of the present invention to provide a micropatterned semiconductor device and a method of manufacturing the same, having an improved write characteristic of a non-volatile memory.

According to an aspect of the present invention, there is provided a semiconductor device comprising a semiconductor substrate of a first conductivity type, a groove formed in the semiconductor substrate, a buried element isolation region formed in the groove, source and drain diffusion regions of a second conductivity type formed inside the buried element isolation region, an electrode wiring layer connected the buried element isolation region across the diffusion regions and constituted by a two-layered structure consisting of a control gate and a floating gate, and a side-wall diffusion region of the first conductivity type which extends along the groove, is in contact with the source and drain diffusion regions, and is formed at a position corresponding to at least the electrode wiring layer, wherein the side-wall diffusion region is formed such that an impurity of the same conductivity type as that of the semiconductor substrate is doped in a side wall of the groove by oblique ion implantation to set an impurity concentration in the side wall to be higher than that of each of other positions of the semiconductor substrate.

According to another aspect of the present invention, there is provided a method of manufacturing a semiconductor device, comprising the steps of: forming a groove in a semiconductor substrate of a first conductivity type; forming a side-wall diffusion region by doping an impurity of the first conductivity type with high concentration in a side wall of the groove by means of oblique ion implantation; forming an element isolation region by burying the groove with an insulating film; forming an electrode wiring layer through a gate insulation film in a predetermined position on the semiconductor substrate while being in contact with the element isolation region; and forming source and drain diffusion regions by doping an impurity of a conductivity type different from that of the semiconductor substrate in a surface of the semiconductor substrate by ion implantation in a self-aligned manner using the electrode wiring layer as a mask.

In the present invention, an impurity region can be easily formed at a portion of the channel region of the non-volatile element in a self-aligned manner without using a resist mask. Therefore, an alignment margin for an alignment precision required when a resist mask is used need not be considered, and the non-volatile element can be micropatterned.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

Brief Description of the Drawings

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a plan view showing the structure of a semiconductor device according to the first embodiment of the present invention;

FIG. 4 is a sectional view showing the semiconductor device taken along a line II—II in FIG. 3 when viewed in a direction of an arrow in FIG. 3;

Detailed Description of the Preferred Embodiments

Embodiments of semiconductor devices according to the present invention will be described in detail with reference to the accompanying drawings.

Figure 1:
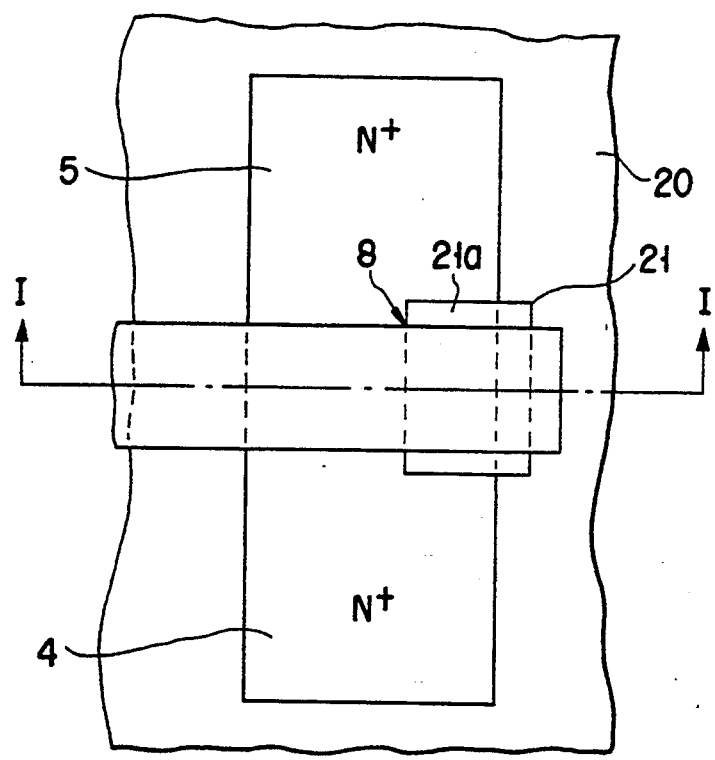
FIG. 1 is a plan view showing a part of a conventional non-volatile memory using a floating gate.
Figure 2:
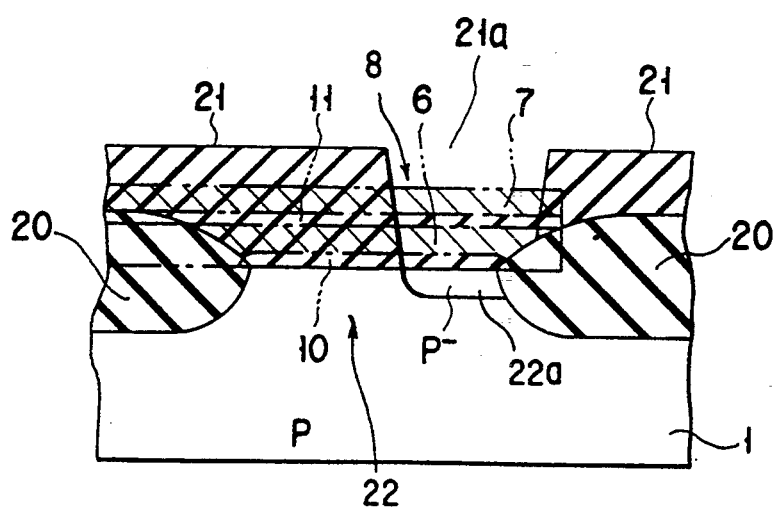
FIG. 2 is a sectional view showing the non-volatile memory along a line I—I in FIG. 1.
Figure 5:
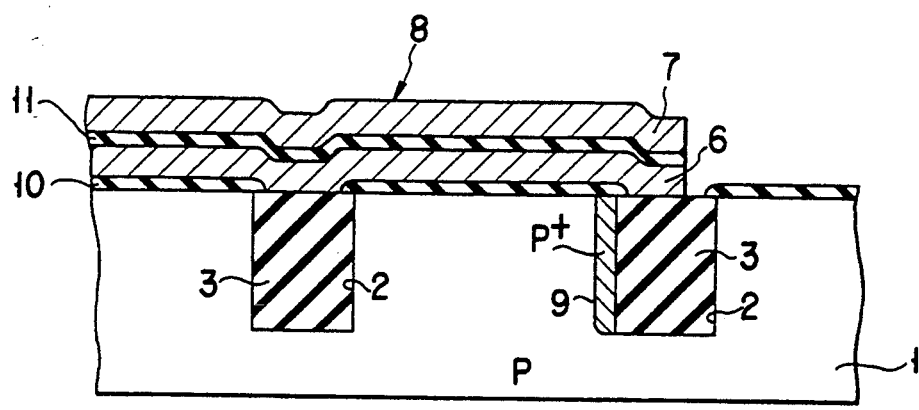
FIG. 5 is a sectional view showing the semiconductor device taken along a line III—III in FIG. 3 when viewed in a direction of an arrow in FIG. 3.

FIG. 3 is a plan view showing the structure of a semiconductor device according to the first embodiment of the present invention, FIG. 4 is a sectional view showing the semiconductor device taken along a line II—II in FIG. 3 when viewed in a direction of an arrow in FIG. 3, FIG. 5 is a sectional view showing the semiconductor device taken along a line III—III in FIG. 3 when viewed in a direction of an arrow in FIG. 3, A groove 2 having, e.g., a hollow rectangular shape is formed in a P-type semiconductor substrate 1. A buried element isolation region 3 is formed in the groove 2. A source diffusion region 4 and a drain diffusion region 5 constituting an element region are formed inside the buried element isolation region 3. An electrode wiring layer 8 constituted by a two-layered structure consisting of a control gate 7 and a floating gate 6 is formed across the source and drain diffusion regions 4 and 5 and overlaps the buried element isolation region 3. A P+-type side-wall diffusion region 9 extending along the buried element isolation region 3 is in contact with the source diffusion region 4 and the drain diffusion region 5, and is formed at a position corresponding to at least the electrode wiring layer 8. The side-wall diffusion layer 9 is formed as follows to improve a write characteristic. That is, an impurity of the same conductivity type as that of the semiconductor substrate 1 is doped in the side walls of the groove 2 by oblique ion implantation such that the impurity concentration of each of the side walls is higher than that of each of other portions of the semiconductor substrate 1. The N+-type source diffusion region 4 and the N+-type drain diffusion region 5 are formed by implanting an impurity of a conductivity type opposite to that of the semiconductor substrate 1 in a self-aligned manner using the electrode wiring layer 8 as a mask. Reference numeral 11 denotes a control gate insulating film, and reference numeral 10 denotes a floating gate insulating film. The first embodiment will be described further below in detail. The P-type semiconductor substrate 1 has a crystal orientation (100) and a resistivity of 1 to 2Ω·cm. The source diffusion region 4 and the drain diffusion region 5 are N+-type diffusion regions each of which has a dose of about $1 \times 10^{22}$ cm$^{-3}$ of As and is formed by implanting As ions at a dose of about $5 \times 10^{15}$ cm$^{-2}$ and an acceleration voltage 35 keV. The non-volatile element has a ordinary structure in which the control gate 7 and the floating gate 6 as formed as a stacked structure on a channel region. Each element region is isolated from other element regions by the buried element isolation region 3. The side-wall diffusion layer 9 is formed by doping a P-type high-concentration impurity, e.g., boron of the same conductivity type as that of the P-type semiconductor substrate 1 at a dose of about $3 \times 10^{20}$ cm$^{-3}$. This side-wall diffusion region 9 is connected to the source diffusion region 4 and the drain diffusion region 5 of the side walls of the semiconductor substrate 1 adjacent to the buried element isolation region 3, and is formed on only one of the side walls of the buried element isolation region 3. The side wall includes a side wall immediately below the electrode wiring layer 8 overlapping the buried element isolation region 3 across the element regions, i.e., the source diffusion region 4 and the drain diffusion region 5.

As described above, in the non-volatile memory using buried element isolation region 3, high electric field concentration area 9 of the drain diffusion region 5, which is used for implanting ions into the floating gate 6 to write the non-volatile memory, is formed by obliquely implanting ions from the side wall of the buried groove 2 into the channel region, which is in contact with the drain diffusion region 5, at the same time when the buried element isolation region 3 is formed.

A method of manufacturing the semiconductor device according to the present invention will be described below with reference to FIGS. 6A to 6G.

Figure 6A:
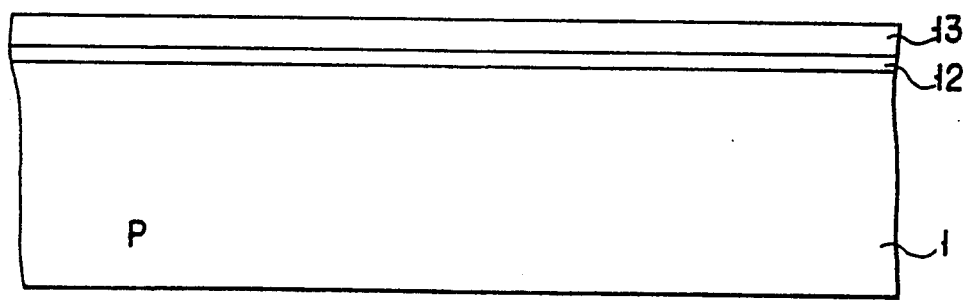
FIGS. 6A to 6G are sectional views showing the steps in manufacturing the semiconductor device according to the present invention.
Figure 6B:
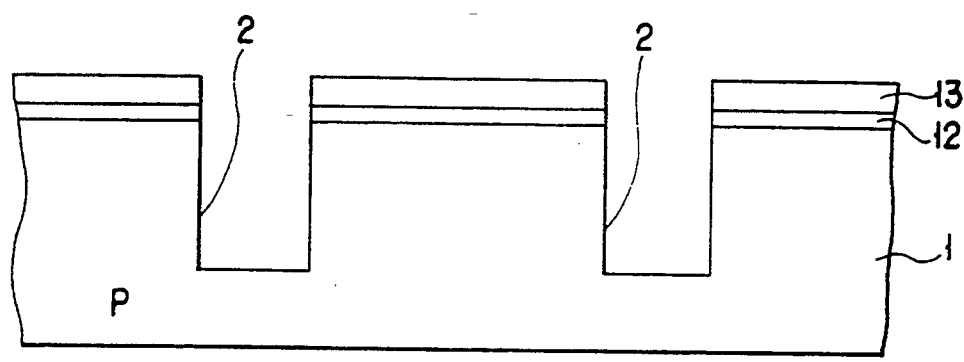
Figure 6C:
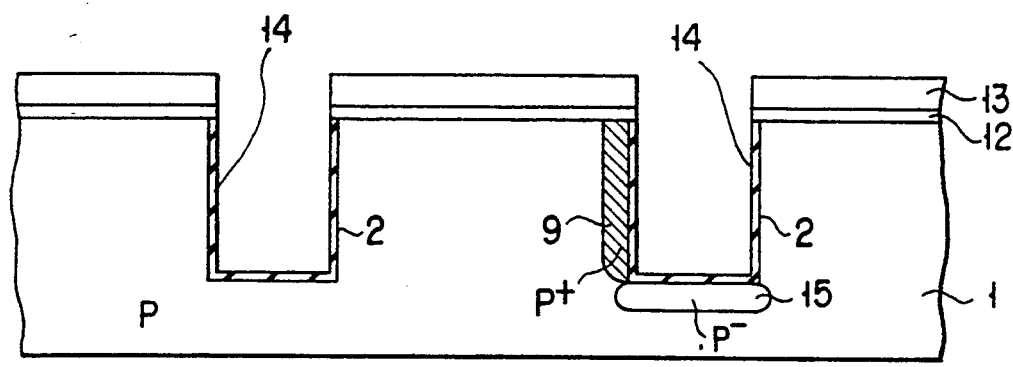
Figure 6D:
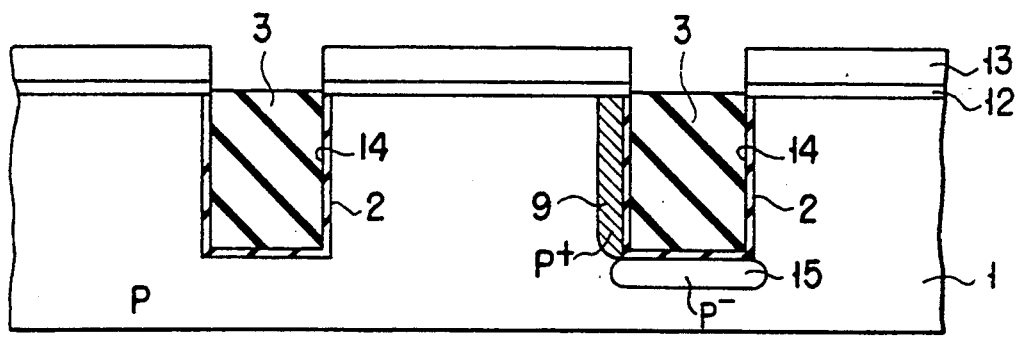
Figure 6E:
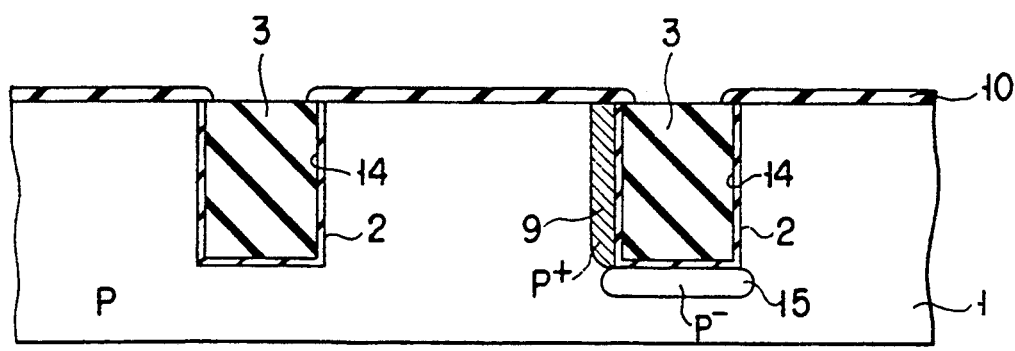
Figure 6F:
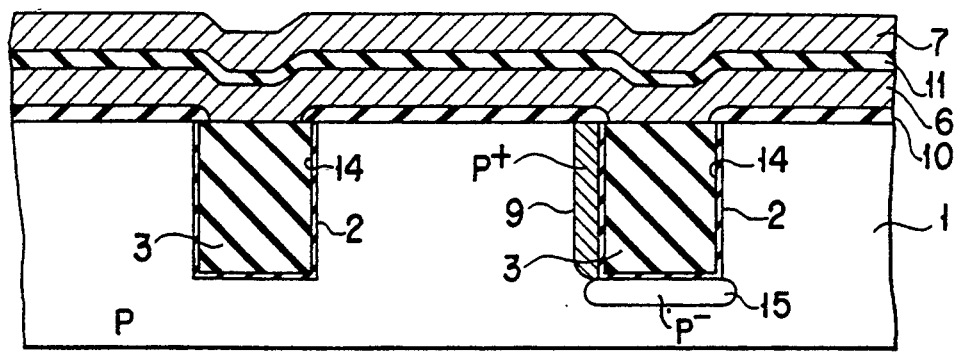
Figure 6G:
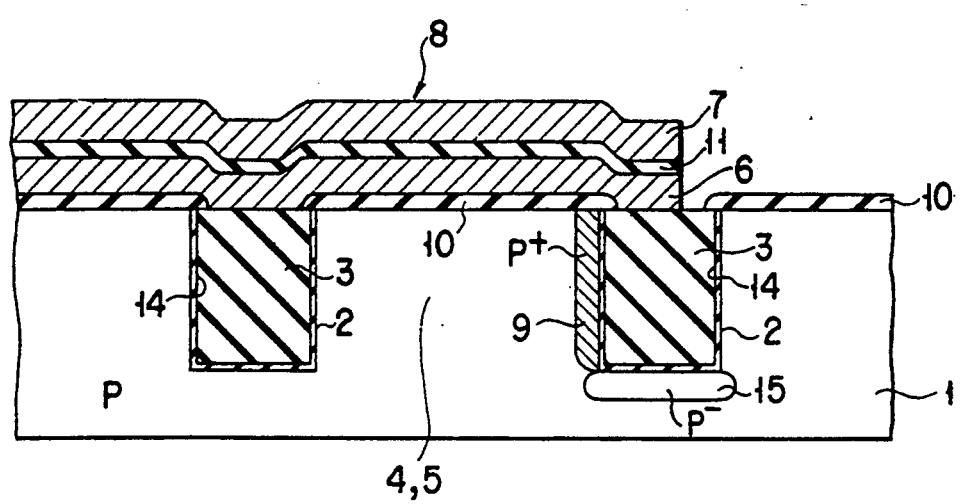

As shown in FIG. 6A, a substrate protection film 12 is formed on the p-type semiconductor substrate 1 having a crystal orientation (100) and a resistivity of 1 to 2Ω·cm by thermal oxidation using dry O$_2$ at 900° C. to have a thickness of 50 nm. An SiN film 13 is formed on the substrate protection film 12 to have a thickness of 100 nm. As shown in FIG. 6B, the SiN film 13 and the substrate protection film 12 at a portion prospectively serving as the buried element isolation region 3 are removed by photoetching. The groove 2 is formed in the semiconductor substrate 1 using the SiN film 13 as a mask to have a depth of 0.5 μm. As shown in FIG. 6C, the surface of the semiconductor substrate 1 on each of the side walls of the groove 2 is thermally oxidized using dry O$_2$ at 900° C. to form an oxide film 14 having a thickness of 10 nm. Subsequently, BF$_2$ ions are obliquely implanted by using the SiN film 13 as a mask in a portion, which extends along the groove 2 and is in contact with source and drain diffusion regions 4 and 5 to be described later and which corresponds to at least an electrode wiring layer to be described later, i.e., the semiconductor substrate 1 immediately under the electrode wiring layer, to form the P-type side-wall impurity diffusion region 9 (B, a dose of about $1 \times 10^{20}$ cm$^{-3}$). The ion implantation is performed at a dose of about $1 \times 10^{14}$ cm$^{-2}$, an acceleration voltage of 15 KeV and an ion implantation angle of 60°. B ions are implanted by normal rotation ion implantation to form an inversion preventing layer 15 of an element isolation region in the semiconductor substrate 1 at the bottom of the groove 2. The ion implantation is performed at a does of about $4 \times 10^{13}$ cm$^{-2}$, an acceleration voltage of 25 KeV and an implantation angle of 83°. As shown in FIG. 6D, a CVD-SiO$_2$ film is formed to bury the groove 2 by CVD (Chemical Vapor Deposition). Subsequently, the CVD-SiO$_2$ film deposited on the SiN film 13 is etched by RIE (Reactive Ion Etching) to expose the SiN film 13 on the surface of the semiconductor substrate 1. Therefore, the CVD-SiO$_2$ film is left in only the groove 2 to form the buried element isolation region 3. As shown in FIG. 6E, the SiN film 13 on the surface of the semiconductor substrate 1 is removed by CDE (Chemical Dry Etching). Channel ion implantation is performed for controlling the characteristics of the element. The ion implantation is performed by implanting BF2 ions at a dose of $2 \times 10^{13}$ cm$^{-2}$ and an acceleration voltage of 15 keV in the element region of the surface the semiconductor substrate 1 through the remaining substrate protection film 12 (not shown). The substrate protection film 12 is removed by an NH$_4$F solution. The first gate insulating film 10 is formed on the exposed surface of the semiconductor substrate 1 by thermal oxidation using dry O$_2$ at 900° to have a thickness of 12 nm. A part of the first gate insulating film 10 serves as a floating gate insulating film. As shown in FIG. 6F, a first polysilicon film 6 is formed to have a thickness of 200 nm. A part of the polysilicon film 6 serves as a floating gate. Subsequently, As ions are implanted in the first polysilicon film 6 at a dose of about $5 \times 10^{15}$ cm$^{-2}$ and an acceleration voltage of 35 keV to decrease the resistance of the first polysilicon film 6. Thereafter, the second gate insulating film 11 is formed on the first polysilicon film 6 by thermal oxidation using dry $O_2$ at 900° C. A part of the second gate insulating film 11 serves as a control gate insulating film. A second polysilicon film 7 is formed on the second gate insulating film 11 to have a thickness of 300 nm. A part of the second polysilicon film 7 serves as a control gate. AS ions are implanted in the second polysilicon film 7 at a dose of $5 \times 10^{15}$ cm$^{-2}$ and an acceleration voltage of 35 keV to decrease the resistance of the second polysilicon film 7. As shown in FIG. 6G, the second polysilicon film 7, the second gate insulating film 11, and the first polysilicon film 6 are sequentially processed by photoetching using RIE. As a result, the electrode wiring layer 8 having the stacked structure formed by the floating gate 6 and the control gate 7 is formed. Thereafter, according to the known method, As ions are implanted in the semiconductor substrate 1 at a dose of $5 \times 10^{15}$ cm$^{-2}$ and an acceleration voltage of 35 keV using the electrode wiring layer 8 as a mask to form the drain diffusion region 5 and the source diffusion region 4 serving as N$^+$-type diffusion regions. An insulating interlayer and lead electrode wiring (Al) are formed to form a required element on the semiconductor substrate 1.

Figure 7:
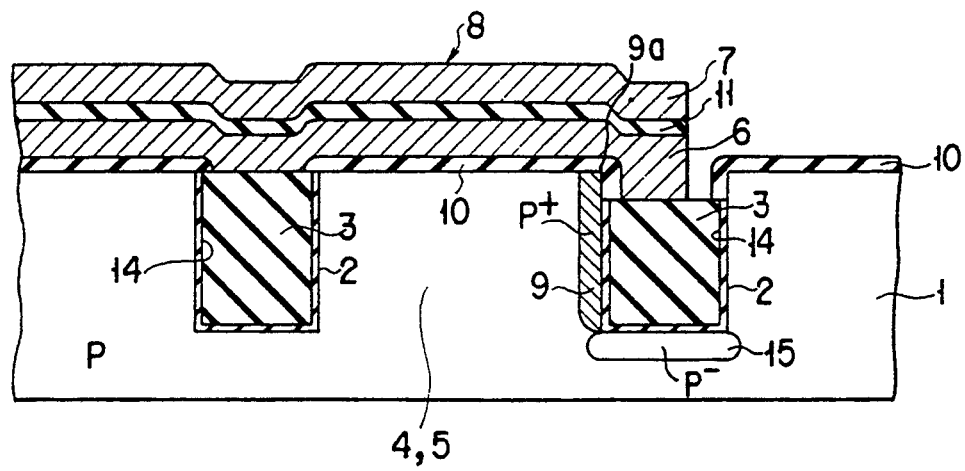
FIG. 7 is a sectional view showing a semiconductor device according to the second embodiment of the present invention.

FIG. 7 is a sectional view showing the structure of a semiconductor device according to the second embodiment of the present invention. According to the second embodiment, after a buried element isolation region 3 is formed in the step shown in FIG. 6D, a CVD-SiO$_2$ film in the buried element isolation region 3 in which a side-wall diffusion region 9 of high impurity concentration is formed is selectively etched by an NH$_4$F solution to form a recessed portion as shown in FIG. 7. Therefore, a first gate insulating film 10 shown in FIG. 6E is also formed in the recessed portion. The first polysilicon film 6 in FIGS. 6F and 6G is formed in the recessed portion. Arrangements other than the above arrangement are the same as those of the first embodiment. The second embodiment has a structure in which electrons easily move from a corner portion 9a at an end of the side-wall diffusion region 9 to a floating gate 6 through the gate insulating film 10. For this reason, in contact to the first embodiment, the second embodiment has an effect of easily causing electric field concentration to occur in the floating gate 6.

According to the present invention, the write characteristic of a non-volatile memory can be improved and simultaneously micropatterned. That is, an impurity region can be easily formed at a portion of the channel region of the non-volatile element in a self-aligned manner without using a resist mask. Therefore, an alignment margin for an alignment precision required when a resist mask is used need not be considered, and the non-volatile element can be micropatterned.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor substrate of a first conductivity type;
   a groove formed in said semiconductor substrate;
   a buried element isolation region formed in said groove;
   source and drain diffusion regions of a second conductivity type formed inside said buried element isolation region;
   an electrode wiring layer disposed above a portion of said buried element isolation region and said diffusion regions, wherein said electrode wiring layer comprises a two-layered structure consisting of a control gate and a floating gate; and
   a side-wall diffusion region of the first conductivity type extending along a portion of said groove, wherein said side-wall diffusion region contacts said source and drain diffusion regions and wherein said side-wall diffusion region is formed at a position corresponding to at least said electrode wiring layer,
   wherein a surface of said buried element isolation region is formed as a recessed portion to have a level lower than that of a surface of said semiconductor substrate, an end of said floating gate being formed in said recessed portion of said buried element isolation region, whereby electric field concentration easily occurs between said side-wall diffusion region and said floating gate.

2. A device according to claim 1, wherein said side-wall diffusion region is formed such that an impurity of the first conductivity type is doped in a side wall of said groove by oblique ion implantation to set an impurity concentration in the side wall to be higher than that of each of other portions of said semiconductor substrate.

3. A device according to claim 1, further comprising an inversion preventing region of the first conductivity type which is formed in the bottom of said buried element isolation region.

4. A device according to claim 3, wherein an impurity concentration of said side-wall diffusion layer is set to be higher than that of said element isolation region.

5. A semiconductor device comprising:
   a semiconductor substrate of a first conductivity type;
   a groove formed in said semiconductor substrate;
   a buried element isolation region formed in said groove;
   source and drain diffusion regions of a second conductivity type formed inside said buried element isolation region;
   an electrode wiring layer disposed above a portion of said buried element isolation region and said diffusion regions, wherein said electrode wiring layer comprises a two-layered structure consisting of a control gate and a floating gate; and
   a side-wall diffusion region of the first conductivity type extending along a portion of said groove, wherein said side-wall diffusion region contacts said source and drain diffusion regions and wherein said side-wall diffusion region is formed at a position corresponding to at least said electrode wiring layer,
   wherein said side-wall diffusion region is formed such that an impurity of the first conductivity type is doped in a side wall of said groove by oblique ion implantation to produce a higher local impurity concentration in the side wall than is present in other portions of the semiconductor substrate.

6. A device according to claim 5, further comprising an inversion preventing region of the first conductivity type which is formed in the bottom of said buried element isolation region.

7. A semiconductor device comprising:
a semiconductor substrate of a first conductivity type;
a groove formed in said semiconductor substrate;
a buried element isolation region formed in said groove;
source and drain diffusion regions of a second conductivity type formed inside said buried element isolation region;
an electrode wiring layer disposed above a portion of said buried element isolation region and said diffusion regions, wherein said electrode wiring layer comprises a two-layered structure consisting of a control gate and a floating gate; and
a side-wall diffusion region of the first conductivity type extending along a portion of said groove, wherein said side-wall diffusion region contacts said source and drain diffusion regions and wherein said side-wall diffusion region is formed at a position corresponding to at least said electrode wiring layer; and
an inversion preventing region of the first conductivity type formed in the bottom of said element isolation region,
wherein an impurity concentration of said side-wall diffusion layer is set to be higher than that of said inversion preventing region.

* * * * *